(12) United States Patent
Yamazaki et al.

(10) Patent No.: US 7,777,792 B2
(45) Date of Patent: Aug. 17, 2010

(54) IMAGE-CAPTURING APPARATUS AND COMPUTER-READABLE COMPUTER PROGRAM PRODUCT INCLUDING IMAGE PROCESSING PROGRAM

(75) Inventors: Hirofumi Yamazaki, Yokohama (JP); Masahiro Suzuki, Inzai (JP)

(73) Assignee: Nikon Corporation, Tokyo (JP)

( * ) Notice: Subject to any disclaimer, the term of this patent is extended or adjusted under 35 U.S.C. 154(b) by 863 days.

(21) Appl. No.: 11/107,849

(22) Filed: Apr. 18, 2005

(65) Prior Publication Data
US 2005/0263677 A1 Dec. 1, 2005

(30) Foreign Application Priority Data
May 27, 2004 (JP) ............................. 2004-157279

(51) Int. Cl.
*H04N 9/64* (2006.01)
(52) U.S. Cl. ...................... 348/248; 348/241; 348/294; 348/302; 348/224.1
(58) Field of Classification Search ................. 348/248, 348/249
See application file for complete search history.

(56) References Cited

U.S. PATENT DOCUMENTS

| 4,329,709 | A |   | 5/1982 | Masuda et al. |
| 4,453,177 | A | * | 6/1984 | Berger et al. ................. 348/282 |
| 5,602,412 | A |   | 2/1997 | Suzuki et al. |
| 5,926,287 | A |   | 7/1999 | Suzuki et al. |
| 6,690,421 | B1 |  | 2/2004 | Yamada et al. |
| 2002/0135743 | A1 | * | 9/2002 | Gindele ....................... 355/18 |

FOREIGN PATENT DOCUMENTS

| JP | A-06-197282 | 7/1994 |
| JP | A-10-136264 | 5/1998 |
| JP | A-2000-324505 | 11/2000 |
| JP | A-2004-135206 | 4/2004 |
| JP | A-2005-278004 | 10/2005 |

* cited by examiner

*Primary Examiner*—Yogesh K Aggarwal
*Assistant Examiner*—Paul Berardesca
(74) *Attorney, Agent, or Firm*—Oliff & Berridge, PLC (57) ABSTRACT

When the quantity of light diagonally entering light-receiving portions of an image-capturing element in an electronic camera is large and thus an electrical charge is generated readily in an electrical charge transfer line, hue correction processing is executed to correct any change occurring in the hue induced by the charge generated in the electrical charge transfer line.

8 Claims, 11 Drawing Sheets

IMAGE-CAPTURING APPARATUS AND COMPUTER-READABLE COMPUTER PROGRAM PRODUCT INCLUDING IMAGE PROCESSING PROGRAM

INCORPORATION BY REFERENCE

The disclosure of the following priority application is herein incorporated by reference: Japanese Patent Application No. 2004-157279 filed May 27, 2004

BACKGROUND OF THE INVENTION

1. Field of the Invention

The present invention relates to an image-capturing apparatus that corrects a change in the hue occurring at a solid image-capturing element having formed therein an on-chip micro-lens and a computer readable computer program product including an image processing program.

2. Description of the Related Art

There is a technology known in the related art whereby a condenser lens is formed in correspondence to each of the light-receiving portions constituting pixels at an image-capturing element, so that the signal level of the photoelectric conversion signal at each pixel can be raised. Japanese Laid Open Patent Publication No. H8-223587 discloses a technology for correcting changes in the quantities of received light corresponding to light wavelengths that occur when the subject light enters the condenser lens in a diagonal direction, i.e., changes in the hue.

However, the color correction in the related art described above is intended for the correction of a change in hue caused by the different quantities of received light corresponding to the individual light wavelengths, which is attributable to on-axis chromatic aberration in the on-chip micro-lens, and does not take into consideration a change in hue caused by light entering the electrical charge transfer portion of the solid image-capturing element.

SUMMARY OF THE INVENTION

An image-capturing apparatus having an image-capturing element that includes a first electrical charge transfer portion corresponding to a specific pixel column, which transfers an electrical charge indicating a first color component, and a second electrical charge transfer portion corresponding to the specific pixel column, which transfers an electrical charge indicating a second color component, and outputs charge signals each corresponding to a light-receiving pixel by executing photoelectric conversion of subject light input via a condenser lens formed in conjunction with each light-receiving pixel comprises a correction device that corrects a first charge signal output from the first electrical charge transfer portion by using a second charge signal output from the second electrical charge transfer portion in units of individual pixels and corrects the second charge signal output from the second electrical charge transfer portion by using the first charge signal output from the first electrical charge transfer portion in units of individual pixels.

In the image-capturing apparatus, the correction device can adjust a correction quantity based upon at least one of; a shutter speed, an exit pupil position at a photographic optical system and an aperture value effective during a photographing operation. The correction device can further adjust the correction quantity in correspondence to a position of the pixel at the image-capturing element.

The correction device can adjust a correction quantity by using the parameter input from an external device. In this case, the image-capturing apparatus can include a photographing signal information output device that outputs photographing signal information needed for the parameter by using the first charge signal and the second charge signal.

The correction device can include a recording device that records the first charge signal and the second charge signal having been corrected by the correction device.

The correction device can correct the first charge signal and the second charge signal yet to be recorded, and can correct the first charge signal and the second charge signal recorded in a recording device.

A computer readable computer program product contains therein an image processing program for enabling a computer apparatus to execute. The image processing program has processing for reading out image signals constituting an image captured by using an image-capturing element that includes a first electrical charge transfer portion corresponding to a specific pixel column, which transfers an electrical charge indicating a first color component, and a second electrical charge transfer portion corresponding to the specific pixel column, which transfers an electrical charge indicating a second color component, and outputs charge signals each corresponding to a pixel, processing for correcting a first charge signal output from the first electrical charge transfer portion by using a second charge signal output from the second electrical charge transfer portion in units of individual pixels, and processing for correcting the second charge signal output from the electrical charge transfer portion by using the first charge signal output from the first electrical charge transfer portion in units of individual pixels.

DETAILED DESCRIPTION OF THE PREFERRED EMBODIMENTS

Figure 1:
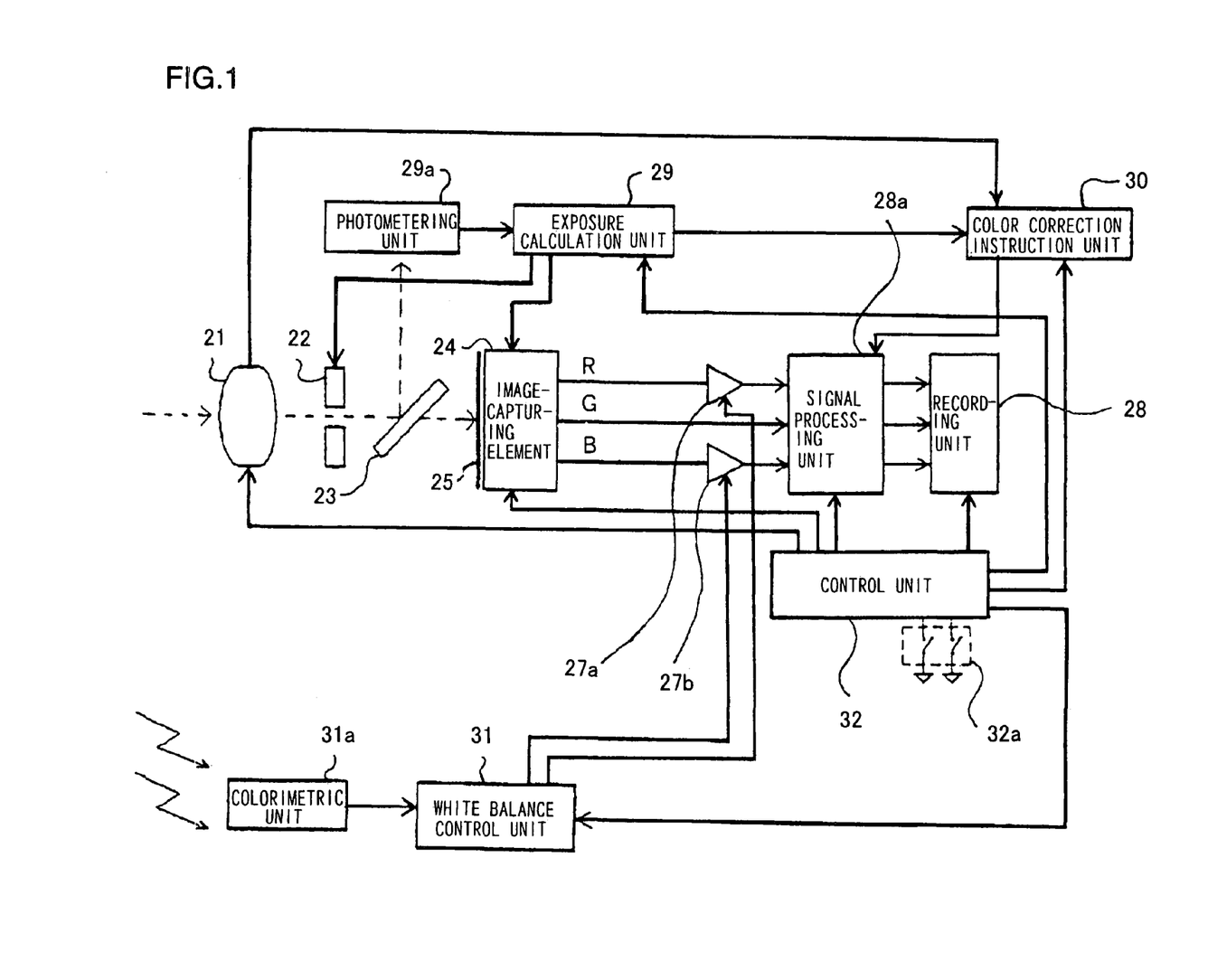
FIG. 1 is a block diagram showing the essential structure of the electronic camera achieved in an embodiment.

The following is an explanation of the preferred embodiments of the present invention given in reference to the drawings. FIG. 1 shows an example in which the image-capturing apparatus according to the present invention is adopted in an electronic camera in a block diagram of the essential structure adopted in the electronic camera in the embodiment. FIG. 1 shows that an aperture 22 and a mirror 23 are disposed on the optical axis of a photographic lens 21, with an image-capturing element 24 disposed on the image-forming surface of the photographic lens 21. An on-chip micro-lens 25 is disposed on the side where the image-capturing surface of the image-capturing element 24 is located.

Figure 2:
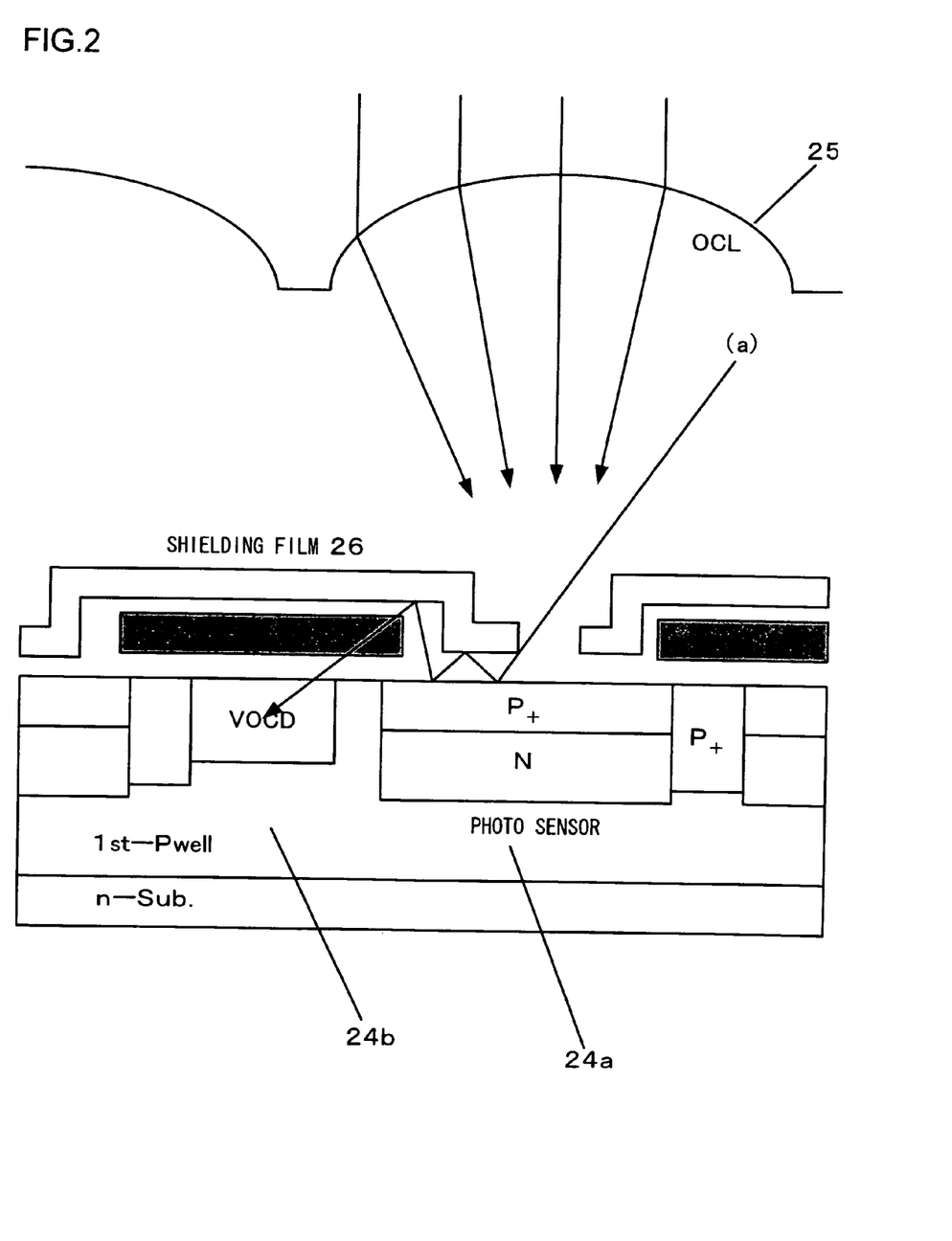
FIG. 2 presents an example of a section of the image-capturing element.

FIG. 2 presents an example of a section of the image-capturing element 24. Light-receiving portions (photosensors) 24a each provided in correspondence to a pixel to convert light to an electrical charge and an electrical charge transfer portion 24b provided to transfer the electrical charges generated at the light-receiving portions 24a are formed at the surface of the image-capturing element 24. Above the image-capturing element 24, an on-chip micro-lens 25 having formed therein condenser lenses each in correspondence to a light-receiving portion 24a is disposed.

Since a subject light flux having entered the on-chip microlens 25 is condensed onto the light-receiving portions 24a, the light-receiving portions 24a receive great quantities of light and are thus able to output an image signal with a high SN ratio at the image-capturing element 24 having the structure described above.

An explanation is given in the specification on an example in which an image is captured through R (red), G (green) and B (blue) color filters arranged in a Bayer array in correspondence to the positions of the individual pixels at the light-receiving element 24. The colors of the image captured at such an image-capturing element are expressed in the RGB calorimetric system. A signal output from the image-capturing element 24 having such color filters contains information on one of the color components R, G and B in correspondence to each pixel. Namely, a pixel in conjunction with which an R color filter is provided outputs an R color signal, a pixel in conjunction with which a G color filter is provided outputs a G color signal and a pixel in conjunction with which a B color filter is provided outputs a B color signal.

In FIG. 1, the G color signal output from the image-capturing element 24 is directly input to a signal processing unit 28a. The R color signal output from the image-capturing element 24 is input to the signal processing unit 28a via a variable gain amplifier 27a provided for white balance adjustment. In addition, the B output color signal output from the image-capturing element 24 is input to the signal processing unit 28a via a variable gain amplifier 27b provided for white balance adjustment. A recording unit 28 that records image signals is connected to an output terminal of the signal processing unit 28a.

A photometering unit 29a that measures the subject brightness is disposed at a position to which light reflected at a mirror 23 is guided. An output signal from the photometering unit 29a is input to an exposure calculation unit 29, and an output signal from the exposure calculation unit 29 is input to control terminals of the aperture 22, the image-capturing element 24 and a color correction instruction unit 30. An output signal from the color correction instruction unit 30 is input to the signal processing unit 28a which then executes hue correction processing to be detailed later based upon the output signal provided by the color correction instruction unit 30.

An output signal from a white balance control unit 31 is input to control terminals of the variable gain amplifiers 27a and 27b. The gains at the variable gain amplifiers 27a and 27b are changed independently of each other based upon the output signal provided by the white balance control unit 31. The white balance control unit 31 executes white balance adjustment by altering the gains at the variable gain amplifiers 27a and 27b based upon a calorimetric signal input from a calorimetric unit 31a that measures the color of ambient light. Namely, it multiplies signals corresponding to the R color and the B color respectively by the R gain and the B gain determined for the white balance adjustment and thus adjusts the signal components corresponding to R, G and B to achieve a predetermined signal component ratio. The R gain and the B gain are both determined by the white balance control unit 31.

A control signal generated at a control unit 32 is input to a zoom mechanism (not shown) disposed inside the photographic lens 21 and information indicating the exit pupil position and originating at the photographic lens 21 is transmitted to the color correction instruction unit 30 via a lens mount unit.

Control signals provided by the control unit 32 are individually input to the image-capturing element 24, the signal processing unit 28a, the recording unit 28, the exposure calculation unit 29, the color correction instruction unit 30 and the white balance control unit 31. An operation signal from a shutter release button 32a is input to the control unit 32.

The image-capturing apparatus in the embodiment is characterized with the hue correction executed at the signal processing unit 28a in response to instructions issued by the color correction instruction unit 30.

Figure 3:
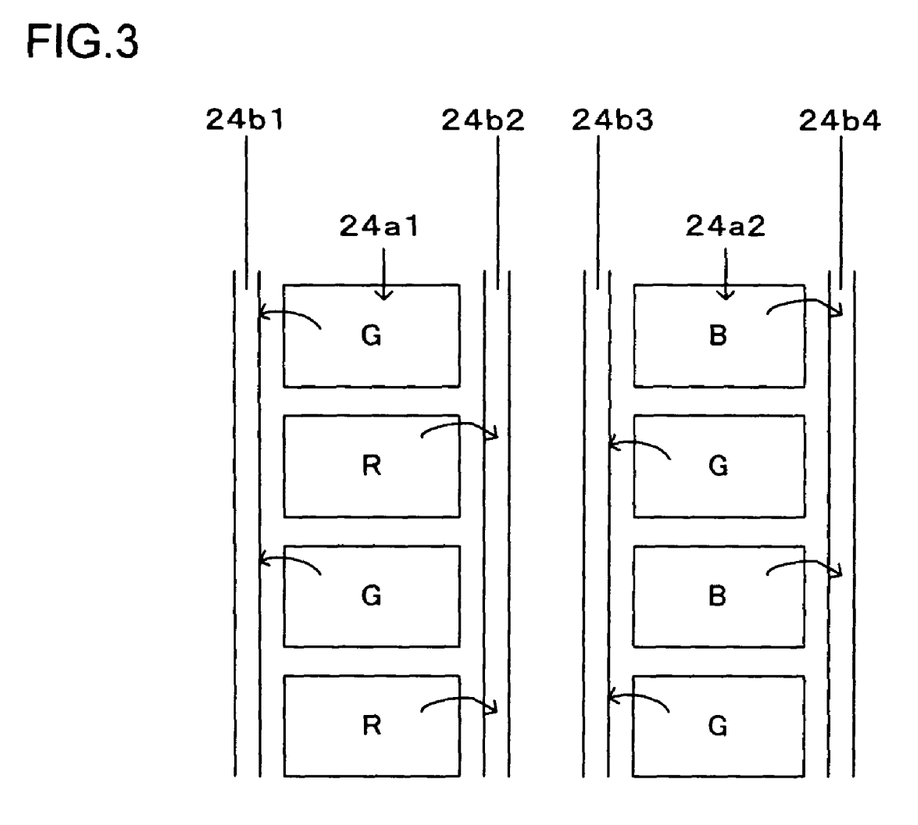
FIG. 3 illustrates the pixel array in the image-capturing element.

FIG. 3 illustrates the pixel array in the image-capturing element 24. FIG. 3 shows a light-receiving portion (pixel) column 24a in which photosensors, each having a color filter G or a color filter R, are alternately disposed. In a light-receiving portion (pixel) column 24a2, photosensors, each having a color filter B or a color filter G, are alternately disposed.

To the left of the pixel column 24a1, an electrical charge transfer line 24b1 is disposed, whereas an electrical charge transfer line 24b2 is disposed to the right of the pixel column 24a1. To the left of the pixel column 24a2, an electrical charge transfer line 24b3 is disposed, whereas an electrical charge transfer line 24b4 is disposed to the right of the pixel column 24a2. The G color signal output from each pixel column is transferred through the electrical charge transfer line located on the left side of the pixel column, and the R color signal or the B color signal output from the pixel column is transferred through the electrical charge transfer line located on the right side.

While the transfer unit 24b (the electrical charge transfer lines 24b1 to 24b4) at the image-capturing element 24 is shielded from light by a shielding film 26 (see FIG. 2), light may still enter the transfer unit 24b (the light beam La in FIG. 2) due to multiple reflection or the like occurring inside the image-capturing element 24. In particular, if the quantity of light entering a light-receiving portion is large, a great deal of light is bound to enter the transfer unit 24b over the area adjacent to the light-receiving portion. Such entry of light causes an electrical charge to be generated in the electrical charge transfer line.

Smearing that occurs when an electrical charge is generated in an electrical charge transfer line over an area adjacent to a pixel with a great quantity of extremely bright light entering therein and this electrical charge having been generated over the adjacent area is added onto the electrical charge (the electrical charge stored at a pixel other than the pixel with the great quantity of light entering therein, with both pixels present along the same transfer line) transferred from the position at which the additional electrical charge has been generated is a well-known phenomenon.

An electrical charge tends to be generated readily in an electrical charge transfer line when a great quantity of light enters a light-receiving portions 24a in a diagonal direction, e.g., when the quantity of light entering the image-capturing element 24 during a regular photographing operation is significant, as well as when photographing a very bright subject. The quantity of light entering in a diagonal direction may be significant under the following circumstances T1 to T3.

T1: the quantity of light entering the image-capturing element is large

T2: the exit pupil position at the photographic lens 21 is close to the on-chip micro-lens 25

T3: the aperture 22 is fully open or is set close to its full open state

Under the circumstances T1 described above in which the quantity of light entering the image-capturing element is large, the absolute light quantity is large and accordingly, the shutter speed is set to a higher setting (e.g., 1/1000 sec or higher) through the exposure calculation executed at the exposure calculation unit 29. Since the absolute light quantity is large, the quantity of light entering the light-receiving portions 24a in a diagonal direction, too, is large.

Under the circumstances T2 described above in which the exit pupil position is close to the on-chip micro-lens 25, the exit pupil position has become closer to the on-chip micro-lens 25 as a result of a zoom magnification factor adjustment at the photographic lens 21. In this case, too, the quantity of light entering the light-receiving portions 24a in a diagonal direction increases.

Under the circumstances T3 described above in which the aperture 2 is substantially in a fully open state (e.g., less than F4), there is a great quantity of light advancing off the optical axis of the photographic lens 21. In this situation, too, the quantity of light entering the light-receiving portions 24a in a diagonal direction increases.

An electrical charge is generated in the electrical charge transfer line where the light enters the light-receiving portions 24a in a diagonal direction, as explained above. For instance, if an electrical charge is generated in the electrical charge transfer line 24b2 corresponding to the R color component as light diagonally enters a light-receiving portion in conjunction with which a G color filter is provided, the G color signal from the light-receiving portion is erroneously handled as an R color signal. Thus, the electrical charge occurring in another electrical charge transfer line induces a change in the hue of the image.

Figure 4:
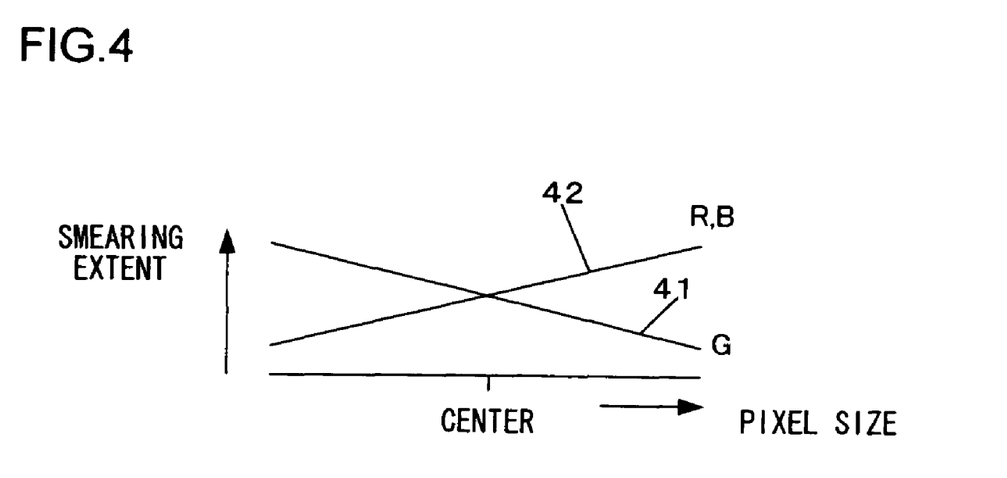
FIG. 4 presents an example of a relationship that may manifest between the position of the light entering a light-receiving portion and the extent of smearing.

FIG. 4 presents an example of a relationship between the position of light entering the light-receiving portions 24a and the extent of smearing. The horizontal axis in FIG. 4 represents the size of the light-receiving portions 24a (i.e., the pixel size measured along the horizontal direction), with the center of the horizontal axis corresponding to the optical axis of the on-chip micro-lens 25. The vertical axis represents the quantity of electrical charge that induces a change in the hue (referred to as the smearing extent in the following explanation).

A straight line 41 representing the smearing extent to which the G color component becomes smeared indicates that the quantity of electrical charge generated at the transfer unit, which is handled as the G color component, increases (the smearing extent of the G component increases) further to the left at the light-receiving portions 24a, closer to the G-color electrical charge transfer line 24b1. In contrast, the quantity of an electrical charge generated at the transfer unit, which is handled as the G component, decreases (the smearing extent of the G component decreases) further to the right at the light-receiving portions 24a, further away from the G-color electrical charge transfer line 24b1.

A straight line 42 representing the smearing extent to which the R color component (B component) becomes smeared indicates that the quantity of electrical charge generated at the transfer unit, which is handled as the R color component (B component), increases (the smearing extent of the R component (B component) increases) further to the right at the light-receiving portions 24a, closer to the R-color (B-color) electrical charge transfer line 24b2. In contrast, the quantity of the electrical charge generated at the transfer unit, which is handled as the R component (B component), decreases (the smearing extent of the R component (B component) decreases) further to the left at the light-receiving portions 24a, further away from the R-color (B-color) electrical charge transfer line 24b2.

It is to be noted that the light that actually enters the light-receiving portions 24a in a diagonal direction is affected by the on-axis chromatic aberration at the on-chip micro-lens 25, and for this reason, the straight line 41 and the straight line 42 may not always achieve a symmetrical relationship, as shown in FIG. 4. Namely, the size of the light spot condensed onto the light-receiving portions 24a varies depending upon the light wavelength (the R component, the G component or the B component). Since the sizes of the light spots are different, the quantities of excess light not contained in the light-receiving portions 24a are different and the smearing extent varies among the different wavelengths.

The color correction instruction unit 30 (see FIG. 1) issues an instruction for the signal processing unit 28a to process the signals corresponding to all the light-receiving portions (all the pixels) at the image-capturing element 24 so as to individually correct such difference among the smearing extents. The hue correction is executed as expressed in (1) to (3) below.

$$R' = R - (G \cdot a \cdot x/n) - (G \cdot b) - (G \cdot c \cdot y/m) \quad (1)$$

$$B' = B - (G \cdot a \cdot x/n) - (G \cdot b) - (G \cdot c \cdot y/m) \quad (2)$$

$$G' = G - ((R+B)/2 \cdot a \cdot (n-x)/n) - ((R+B)/2 \cdot b) - ((R+B)/2 \cdot c \cdot y/m) \quad (3)$$

It is to be noted that pre-correction image signals are expressed as R (x, y), B (x, y) and G (x, y) and that post-correction image signals are expressed as R' (x, y), B' (x, y) and G' (x, y). x and y are coordinates. In addition, the expressions above include shading correction values, i.e., "a" representing a coefficient of the smearing extent dependent on the x coordinate, "b" representing a coefficient of the smearing extent which is not dependent on the x coordinate and "c" representing a coefficient of the smearing quantity dependent on the y coordinate. "n" represents the total number of pixels arrayed along the horizontal direction at the image-capturing element 24 and "m" represents the total number of pixels arrayed along the vertical direction at the image-capturing element 24.

The signal processing unit 28a individually executes the correction operation expressed as in (1) to (3) above on the values indicated by the signals corresponding to the R output, the B output and the G output input thereto.

Figure 5:
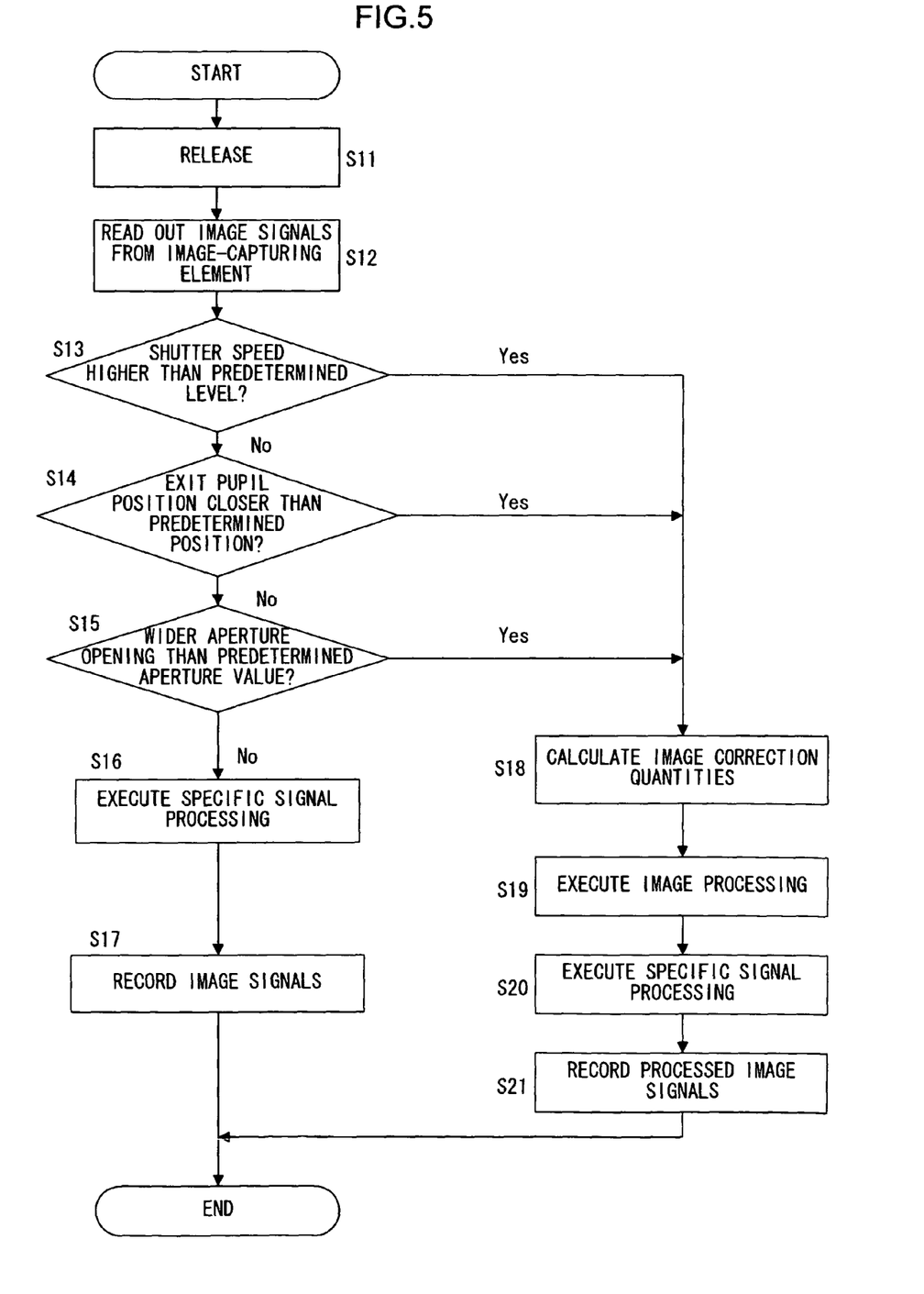
FIG. 5 presents a flowchart of the photograph processing executed at the control unit.

FIG. 5 presents a flowchart of the photograph processing executed at the control unit 32. In step S11 in FIG. 5, the control unit 32 executes a specific type of photograph processing in response to an operation signal input thereto from the shutter release button 32a and then the operation proceeds to step S12. In step S12, the control unit 32 issues an instruction for reading out image signals from the image-capturing element 24 before the operation proceeds to step S13. More specifically, the control unit 32 outputs a drive signal to the image-capturing element 24 and in response, electrical charge signals having been stored at the image-capturing element 24 are sequentially output from the image-capturing element 24 to be stored into the signal processing unit 28a as image signals.

In step S13, the control unit 32 makes a decision as to whether or not the shutter speed set for the photographing operation is higher than the level indicated by a predetermined value. The control unit 32 makes an affirmative decision in step S13 if the shutter speed set for the photographing operation is higher than, for instance, $1/1000$ sec to proceed to step S18, whereas it makes a negative decision in step S13 if the shutter speed is equal to or lower than $1/1000$ sec to proceed to step S14. The operation proceeds to step S18 to execute the hue correction.

In step S14, the control unit 32 makes a decision as to whether or not the exit pupil position during the photographing operation is closer to the image-capturing element 24 relative to a predetermined position. The control unit 32 makes an affirmative decision in step S14 if the exit pupil position during the photographing operation is closer to the image-capturing element relative to the predetermined position to proceed to step S18, whereas it makes a negative decision in step S14 if the exit pupil position is further away from the image-capturing element relative to the predetermined position to proceed to step S15. The operation proceeds to step S18 to execute the hue correction.

In step S15, the control unit 32 makes a decision as to whether or not the aperture value set for the photographing operation indicates a wider opening relative to a predetermined aperture value. The control unit 32 makes an affirmative decision in step S15 if the aperture value set for the photographing operation indicates a wider aperture opening than, for instance, F4 to proceed to step S18, whereas it makes a negative decision in step S15 if the aperture value indicates a smaller aperture opening than F4 to proceed to step S16. The operation proceeds to step S18 to execute the hue correction.

In step S16, the control unit 32 issues an instruction for the signal processing unit 28a to execute a specific type of signal processing such as pixel interpolation processing before proceeding to step S17. In response, the signal processing unit 28a executes the signal processing on the image signals stored therein.

In step S17, the control unit 32 issues an instruction for recording the image signals before the processing in FIG. 5 ends. The recording unit 28, in turn, records the image signals having undergone the signal processing into a recording medium (not shown).

In step S18, the control unit 32 issues an instruction for the color correction instruction unit 30 to calculate image correction quantities, before the operation proceeds to step S19. In response, the color correction instruction unit 30 determines the coefficients "a", "b" and "c" explained earlier based upon the shutter speed, the aperture value and the exit pupil position effective during the photographing operation. The relationship of the coefficients a, b and c to the shutter speed, the aperture value and the exit pupil position is defined in advance as a table which is stored in a memory (not shown) within the color correction instruction unit 30. The color correction instruction unit 30 references the table by using the shutter speed, the aperture value and the exit pupil position as arguments and reads the corresponding coefficients a, b and c individually.

In step S19, the control unit 32 issues an instruction for the color correction instruction unit 30 to execute image processing (hue correction), before the operation proceeds to step S20. In response, the color correction instruction unit 30 issues an instruction for the signal processing unit 28a to execute a hue correction operation by using expressions (1) to (3) presented earlier and the coefficients a, b and c.

In step S20, the control unit 32 issues an instruction for the signal processing unit 28a to execute a specific type of signal processing such as pixel interpolation processing before proceeding to step S21. In response, the signal processing unit 28a executes the signal processing on the image signals stored therein.

In step S21, the control unit 32 issues an instruction for recording the image signals before the processing in FIG. 5 ends. The recording unit 28, in turn, records the image signals having undergone the signal processing into a recording medium (not shown).

The embodiment described above is now summarized.

(1) When a great quantity of light enters the light-receiving portions 24a in a diagonal direction at the image-capturing element 24 and thus, electrical charges tend to be generated readily in the electrical charge transfer lines in the electronic camera, hue correction processing for correcting any change occurring in the hue due to such generated electrical charges is executed on the image signals resulting from the photographing operation. As a result, image signals indicating accurate hues and achieving a high image quality are obtained.

(2) The following three situations are set aside as circumstances under which light enters the light-receiving portions 24a in a diagonal direction, and if the photographing conditions indicated at least one of these three situations (if an affirmative decision is made in one of steps S13 to S15 in FIG. 5), the hue correction is automatically executed (steps S18 and S19). Since the hue correction is executed automatically without requiring the photographer to perform any operation, the operability of the camera is improved.

1 When the quantity of incident light is large (when a high shutter speed is selected)

2 When the exit pupil position at the photographic lens 21 is close to the on-chip micro-lens 25

3 When the aperture 22 is set at or close to a full open setting.

(3) Since the hue correction is executed by using expressions (1) to (3) presented earlier, all the image signals corresponding to the pixels constituting the image can each be corrected in an optimal manner, regardless of the specific position (coordinates) of a pixel on the image-capturing element 24.

Figure 6:
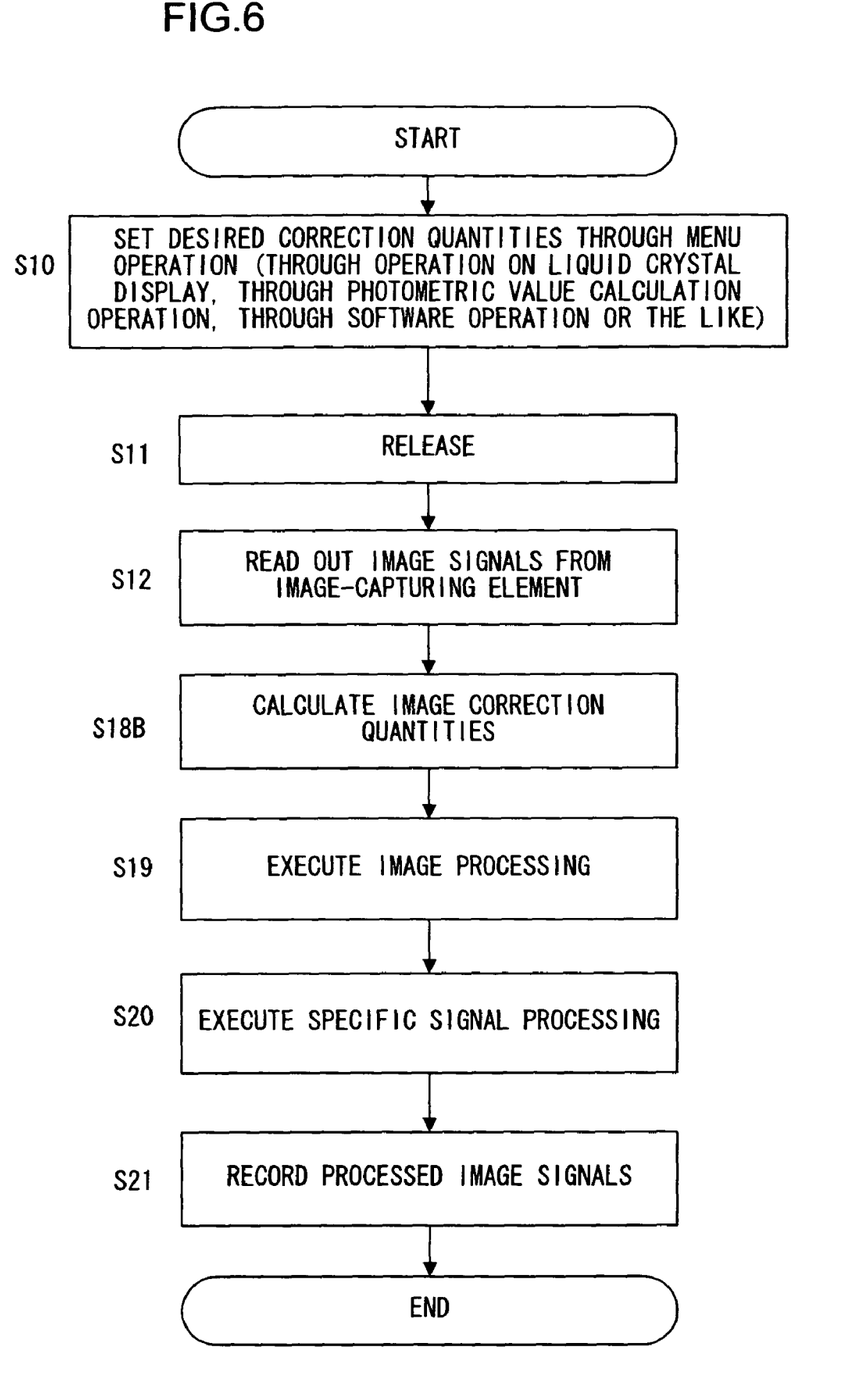
FIG. 6 presents a flowchart of the processing executed to correct the hue with the hue correction quantity set through a manual operation.

While the hue correction quantities are automatically determined in the electronic camera in the explanation provided above, the hue correction may instead be executed with hue correction quantities set by the photographer through a manual operation. FIG. 6 presents a flowchart of the photograph processing executed at the control unit 32 under such circumstances. In step S10 in FIG. 6, the control unit 32 provides information indicating the coefficients a, b and c input by the photographer through a manual operation to the color correction instruction unit 30 and then the operation proceeds to step S11. In response, the coefficients a, b and c are stored into the color correction instruction unit 30.

Since the processing executed in step S11 and subsequent steps, except for step S18B, is identical to the processing executed in the steps assigned with the same step numbers in FIG. 5, its explanation is omitted. In step S18B, the control unit 32 issues an instruction for the color correction instruction unit 30 to calculate hue correction quantities and then the operation proceeds to step S19. In response, the color correction instruction unit 30 reads out the coefficients a, b and c stored therein. Through the processing in FIG. 6, the hue correction is executed as desired by the photographer, regardless of the shutter speed, the aperture value and the exit pupil position effective during the photographing operation.

While the coefficients a, b and c are set through the manual operation performed by the photographer in step S10 in FIG. 6, the coefficients a, b and c may be set in the electronic camera using an external apparatus such as a personal computer instead of through the manual operation of the electronic camera.

Figure 7:
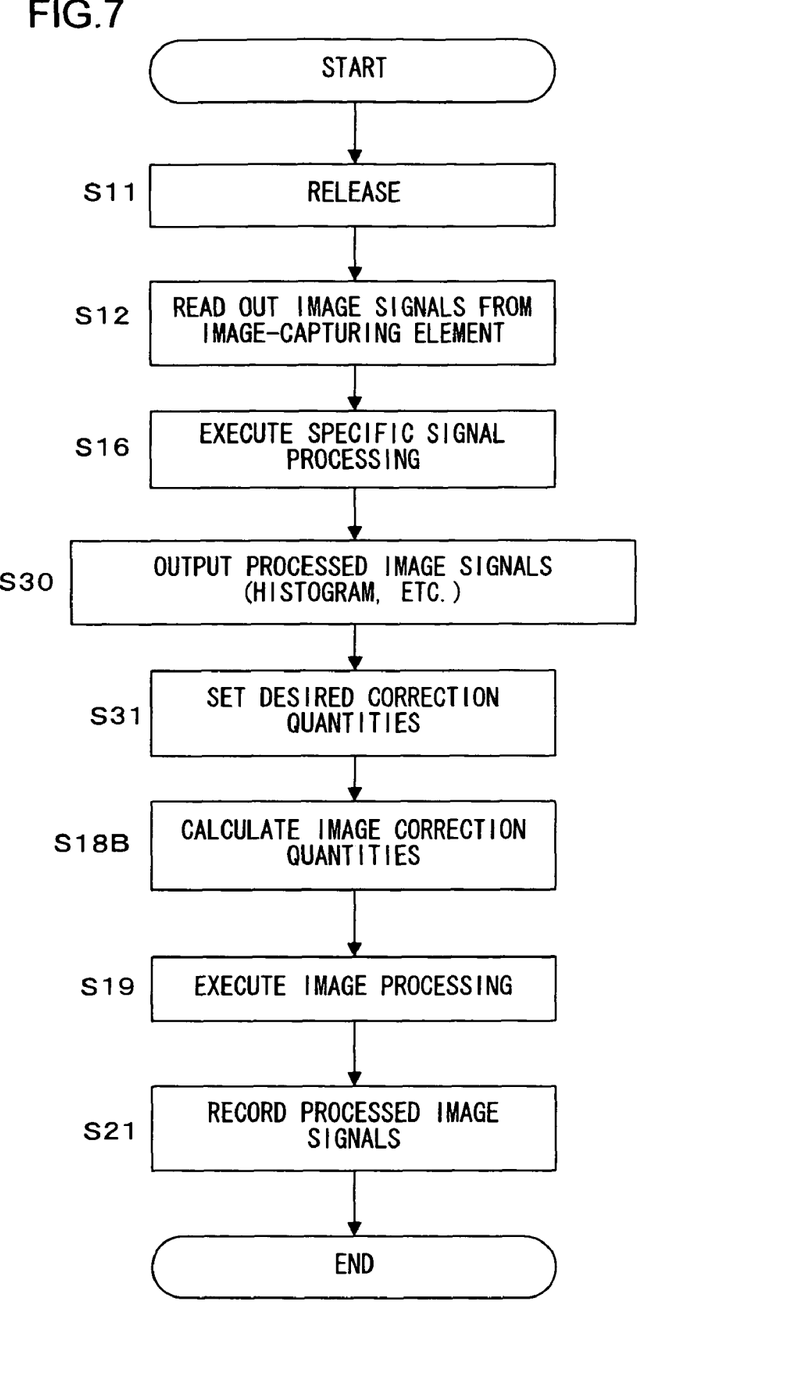
FIG. 7 presents a flowchart of a variation of the processing executed to correct the hue with the hue correction quantity set through a manual operation.

FIG. 7 presents a flowchart of a variation of the hue correction processing executed with the hue correction quantities set by the photographer through the manual operation. Since the processing executed in steps S11, S12 and S16 is identical to the processing executed in the steps assigned with the same step numbers in FIG. 5, its explanation is omitted.

In step S30, the control unit 32 engages the signal processing unit 28a to output the image signals stored therein and then the operation proceeds to step S31. In response, photographing signal information (a histogram indicating the signal levels of the image signals and psychophysical color specification values corresponding to the individual colors) is displayed at a display monitor screen (not shown).

As the photographer sets the coefficients a, b and c through an operation member (not shown) by referencing the photographing signal information displayed at the display monitor, the control unit 32 provides the color correction instruction unit 30 with information indicating the coefficients a, b and c decided by the photographer in step S31 and then the operation proceeds to step S18B. As a result, the coefficients a, b and c are stored into the color correction instruction unit 30.

Since the processing executed in step S18B and subsequent steps is identical to the processing executed in the steps assigned with the same step numbers in FIG. 6, its explanation is omitted. Through the processing in FIG. 7, the hue correction is executed with the coefficients a, b and c selected by the photographer by checking the photographing signal information displayed at the display monitor screen, regardless of the shutter speed, the aperture value and the exit pupil position effective during the photographing operation.

Figure 8:
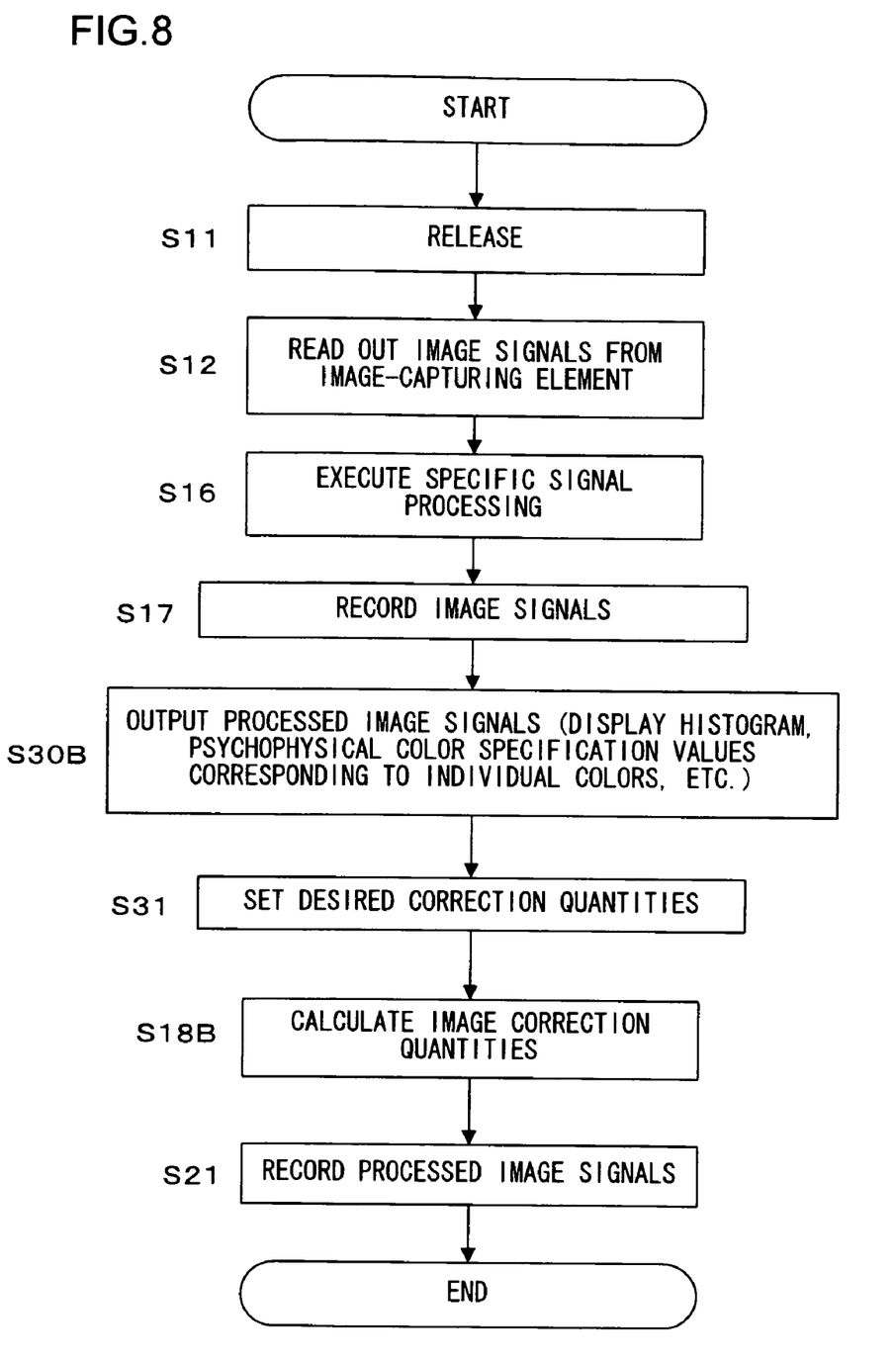
FIG. 8 presents a flowchart of another variation of the processing executed to correct the hue with the hue correction quantity set through a manual operation.

FIG. 8 presents a flowchart of another variation of the hue correction processing executed with the hue correction quantities set through the manual operation. In the processing shown in FIG. 8, the image signals are temporarily recorded without executing any hue correction and then the hue correction is executed by reading out the recorded image signals. Since the processing executed in steps S11, S12, S16 and S17 in FIG. 8 is identical to the processing executed in the steps assigned with the same step numbers in FIG. 5, its explanation is omitted.

In step S30B, the control unit 32 engages the recording unit 28 to read out the image signals recorded in the recording medium (not shown) and then the operation proceeds to step S31. If the image signals have been compressed, decompression processing is also executed at this time. As a result, photographing signal information (a histogram indicating the signal levels of the image signals and psychophysical color specification values corresponding to the individual colors) is displayed at a display monitor screen (not shown).

Since the processing executed in step S31 and subsequent steps is identical to the processing executed in steps assigned with the same step numbers in FIG. 6, its explanation is omitted. Through the processing shown in FIG. 8, the image signals resulting from the photographing operation are recorded into the recording medium so as to enable a hue correction to be executed later on the image signals recorded in the recording medium.

Figure 9:
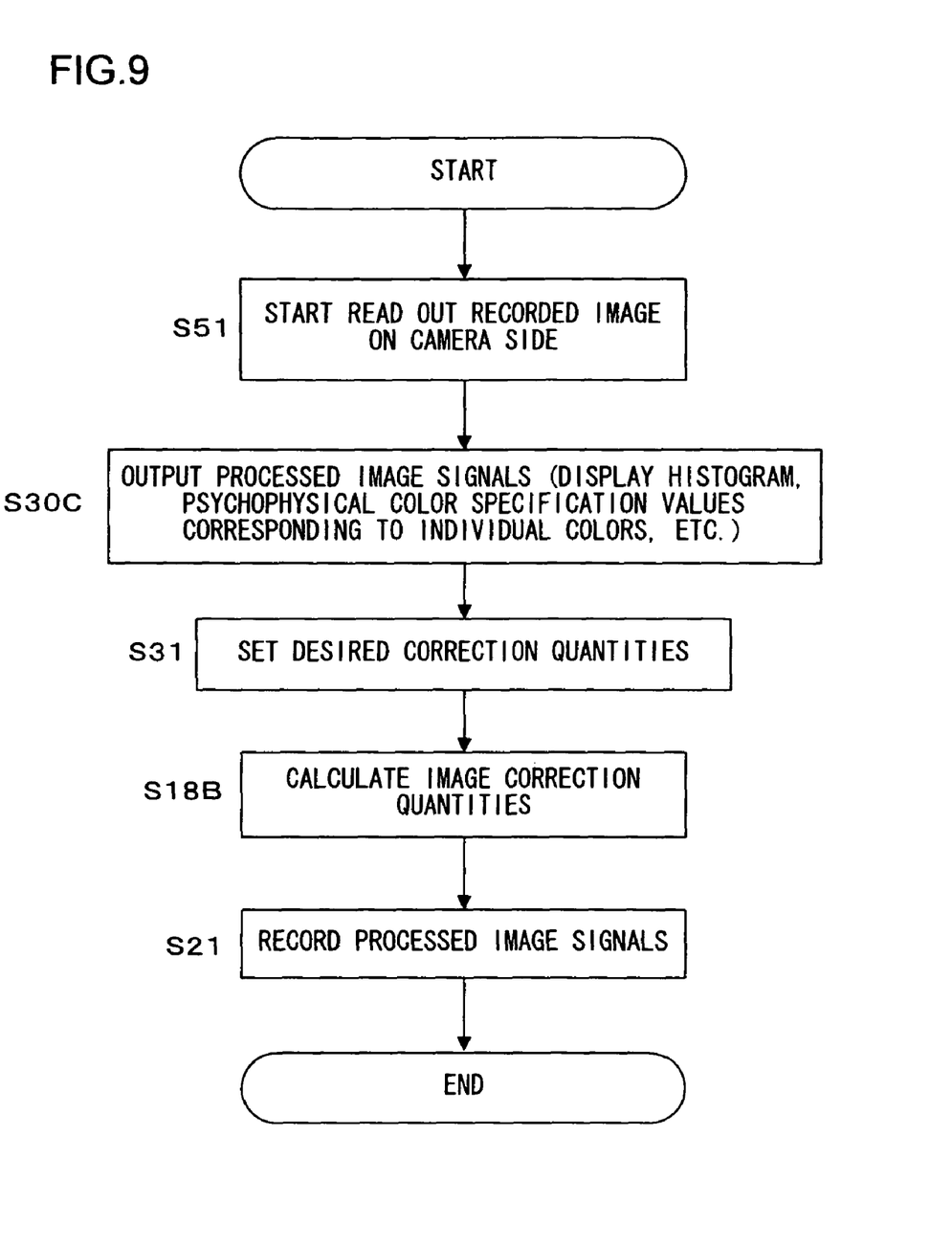
FIG. 9 presents a flowchart of the processing executed on image signals already recorded in the recording medium to correct the hue.

FIG. 9 presents a flowchart of hue correction processing executed on image signals having resulted from a photographing operation executed in another electronic camera or the like and having already been recorded in a recording medium. In step S51 in FIG. 9, the control unit 32 engages the recording unit 28 to read out the image signals recorded in the recording medium (not shown) and then the operation proceeds to step S30C. If the image signals have been compressed, decompression processing is also executed at this time.

In step S30C, the control unit 32 enables an output of the image signals having been read out, before proceeding to step S31. As a result, photographing signal information (a histogram indicating the signal levels of the image signals and psychophysical color specification values corresponding to the individual colors) is displayed at a display monitor screen (not shown).

Since the processing executed in step S31 and subsequent steps is identical to the processing executed in steps assigned with the same step numbers in FIG. 6, its explanation is omitted. Through the processing shown in FIG. 9, a hue correction can be executed later on image signals having been recorded into a recording medium.

While an explanation is given above on an example in which the present invention is adopted in an electronic camera, an image processing program for enabling such hue correction processing may be prepared in advance, and this program may be taken into a personal computer or the like to allow the personal computer to be used as a hue correction apparatus. In such a case, the program should be loaded into a data storage device of the personal computer and then the program should be executed to enable the personal computer to function as a hue correction apparatus. The program may be loaded by installing a recording medium having stored therein the program into the personal computer, or by downloading the program to the personal computer via a network.

Figure 10:
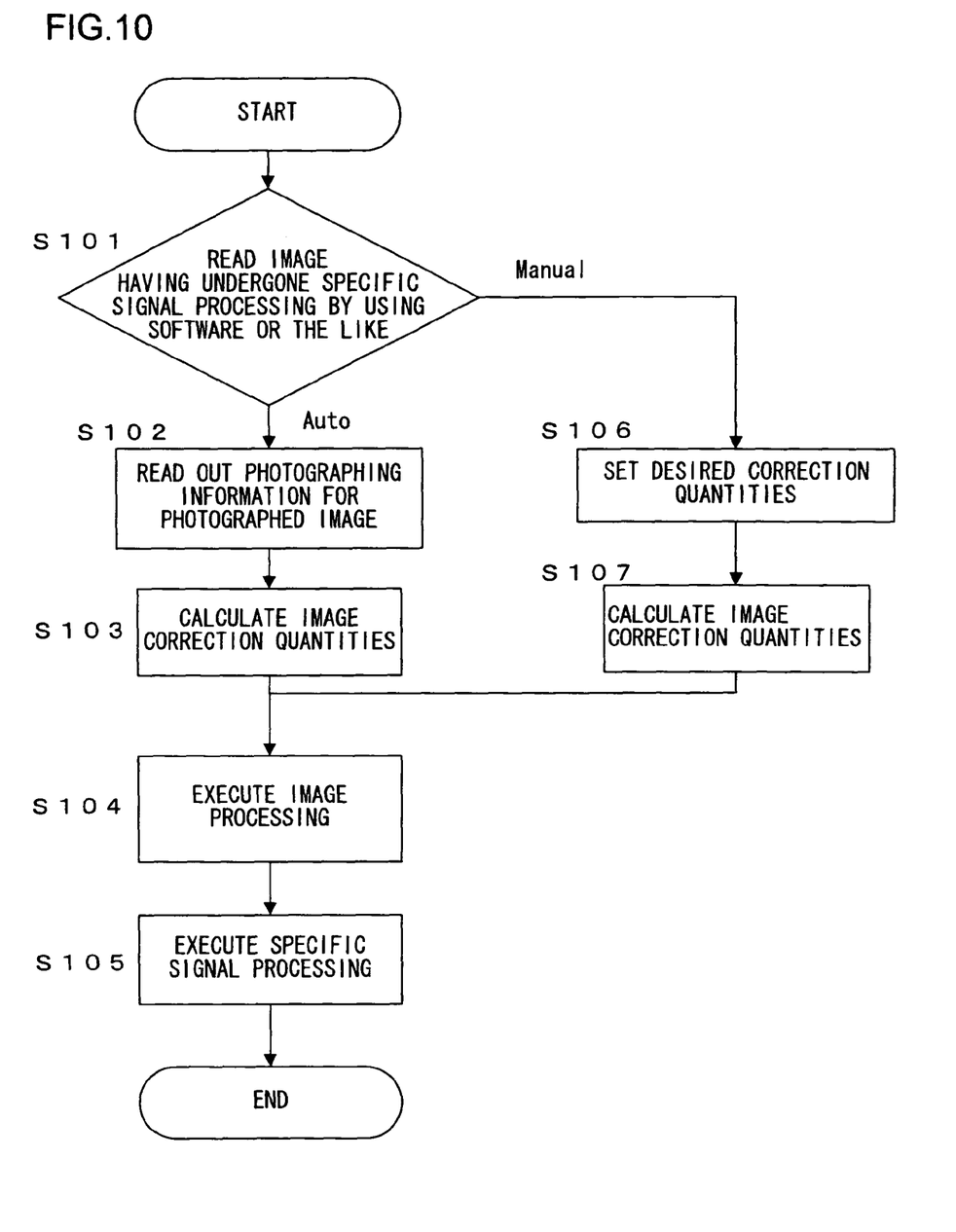
FIG. 10 presents a flowchart of the processing executed in conformance to the image processing program.

FIG. 10 presents a flowchart of the processing executed in conformance to the image processing program. In step S101 in FIG. 10, the CPU of the personal computer reads out image signals having resulted from a photographing operation executed at an electronic camera and having already been recorded. If the recorded data are compressed, decompression processing is also executed at this time. In addition, if an instruction for automatically setting the hue correction quantities has been issued, the CPU proceeds to step S102 (Auto), whereas if an instruction for executing the hue correction with the hue correction quantities set by the operator through a manual operation has been issued, the CPU proceeds to step S106 (Manual).

In step S102, the CPU reads out photographing information recorded in the header portion of the file having stored therein the image signals and then the operation proceeds to step S103. The photographing information contains data indicating, at least, the shutter speed, the aperture value and the exit pupil position effective when the image was photographed.

In step S103, the CPU calculates the image correction quantities before the operation proceeds to step S104. More specifically, the coefficients a, b and c explained earlier are determined in correspondence to the shutter speed, the aperture value and the exit pupil position effective during the photographing operation. The relationship of the coefficients a, b and c to the shutter speed, the aperture value and the exit pupil position is defined in advance in a table that is included in the program.

In step S104, the CPU executes image processing (hue correction) before proceeding to step S105. The CPU executes the hue correction operation by using expressions (1) to (3) presented earlier and the coefficients a, b and c.

In step S105, the CPU executes signal processing necessary for displaying an image reproduced by using the corrected image signals at a display device (not shown) and recording the corrected image signals before ending the processing shown in FIG. 10.

As the operator sets the coefficients a, b and c through an operation member such as a keyboard (not shown), the CPU sets the coefficients a, b and c decided by the operator at a register in step S106, and then the operation proceeds to step S107.

In step S107, the CPU calculates the image correction quantities before proceeding to step S104. More specifically, it reads out the coefficients a, b and c having been set.

Through the processing in FIG. 10 described above, any change in the hue induced by smearing and the like can be corrected later by using a personal computer to execute a hue correction on image signals having been obtained through a photographing operation.

Figure 11:
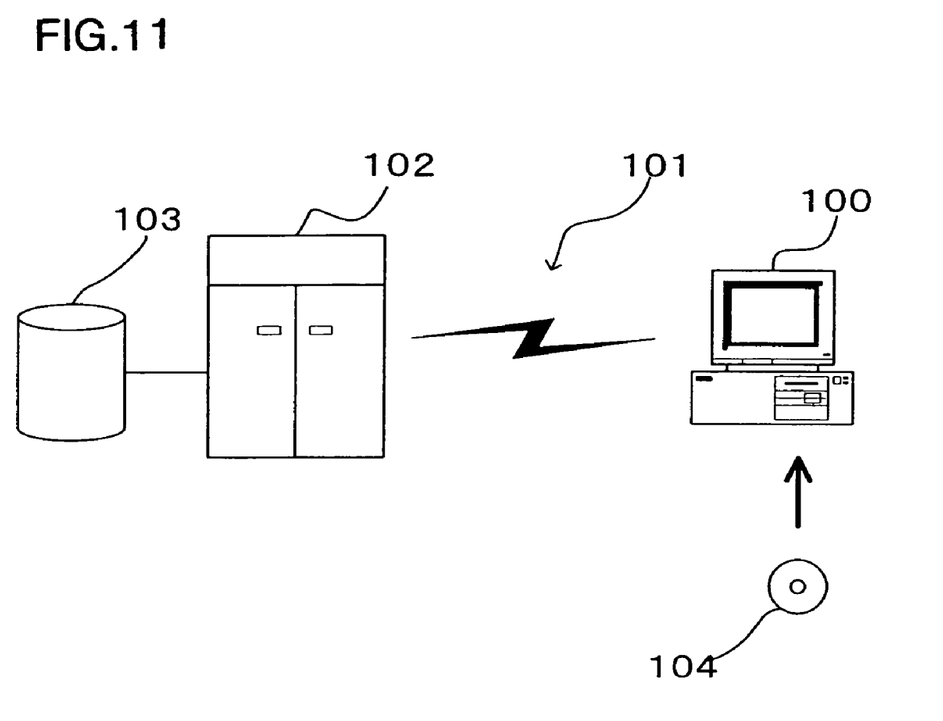
FIG. 11 shows how the program may be provided to a personal computer via a CD-ROM or a computer.

FIG. 11 shows how the program may be provided to a personal computer 100 via a CD-ROM 104 or a computer 102. The personal computer 100 takes in the program via the CD-ROM 104. In addition, the personal computer 100 is capable of achieving a connection with a communication line 101. The computer 102 is a server computer that provides the program stored in a recording medium such as a hard disk 103. The communication line 101 may be a communication line for Internet communication, personal computer communication or the like, or it may be a dedicated communication line. The computer 102 reads out the program from the hard disk 103 and transmits the program to the personal computer 100 via the communication line 101. In other words, the program embodied as a data signal on a carrier wave is transmitted via the communication line 101. The program can thus be distributed as a computer readable computer program product assuming any of various modes including a recording medium and a carrier wave.

The present invention is not limited to the embodiments described above. For instance, while the color filters of three colors R, G and B are used in the explanation provided above, filters each corresponding to one of four or more colors may be used or filters each corresponding to C (cyan), Y (yellow) or M (magenta) may be used instead.

What is claimed is:

1. An image-capturing apparatus comprising:
    an image-capturing element that includes:
        a specific pixel column,
        a first electrical charge transfer portion corresponding to the specific pixel column, which transfers an electrical charge indicating a first color component, the first electrical charge transfer portion being disposed at one side of the specific pixel column, and
        a second electrical charge transfer portion corresponding to the specific pixel column, which transfers an electrical charge indicating a second color component, the second electrical charge transfer portion being disposed at the other side of the specific pixel column,
    wherein the image-capturing element outputs charge signals each corresponding to a light-receiving pixel by executing photoelectric conversion of subject light input via a condenser lens formed in conjunction with each light-receiving pixel; and
    a correction device that corrects a first charge signal output from the first electrical charge transfer portion with a first correction quantity calculated by using a second charge signal output from the second electrical charge transfer portion in units of individual pixels, and corrects the second charge signal output from the second electrical charge transfer portion with a second correction quantity calculated by using the first charge signal output from the first electrical charge transfer portion in units of individual pixels, wherein
    the correction device calculates the first correction quantity to become larger as a position of a target light-receiving pixel is located closer to an end of the image-capturing element in a direction of the one side of the specific pixel column, and calculates the second correction quantity to become larger as a position of a target light-receiving pixel is located closer to an end of the image-capturing element in a direction of the other side of the specific pixel column.

2. An image-capturing apparatus according to claim 1, wherein:
    the correction device includes an input unit to which a parameter to be used for correction processing is input and adjusts the first correction quantity and the second correction quantity by using the parameter input to the input unit.

3. An image-capturing apparatus according to claim 2, further comprising:
    a photographing signal information output device that outputs photographing signal information needed for the parameter by using the first charge signal and the second charge signal.

4. An image-capturing apparatus according to claim 1, further comprising:
    a recording device that records the first charge signal and the second charge signal having been corrected by the correction device.

5. An image-capturing apparatus according to claim 1, wherein:
    the correction device executes correction by reading out the first charge signal and the second charge signal from a recording device at which the first charge signal and the second charge signal yet to be corrected are recorded.

6. A non-transitory computer readable memory medium storing an image processing program for enabling a computer apparatus to execute, the image processing program comprising:
    instructions to read out image signals constituting an image captured by using an image-capturing element that includes a first electrical charge transfer portion disposed at one side of a specific pixel column, which transfers an electrical charge indicating a first color component, and a second electrical charge transfer portion disposed at the other side of the specific pixel column, which transfers an electrical charge indicating a second color component, and outputs charge signals each corresponding to a pixel;
    instructions to correct a first charge signal output from the first electrical charge transfer portion with a first correction quantity calculated by using a second charge signal output from the second electrical charge transfer portion in units of individual pixels; and
    instructions to correct the second charge signal output from the second electrical charge transfer portion with a second correction quantity calculated by using the first charge signal output from the first electrical charge transfer portion in units of individual pixels, wherein the first correction quantity is calculated to become larger as a position of a target light-receiving pixel is located closer to an end of the image-capturing element in a direction of the one side of the specific pixel column; and the second correction quantity is calculated to become larger as a position of a target light-receiving pixel is located closer to an end of the image-capturing element in a direction of the other side of the specific pixel column.

7. An image-capturing apparatus according to claim 1, wherein:

the correction device adjusts the first correction quantity and the second correction quantity based upon at least one of:

a shutter speed, an exit pupil position at a photographic optical system and an aperture value effective during a photographing operation in at least one of:

a case that the shutter speed is higher than a predetermined shutter speed, a case that the exit pupil position at a photographic optical system is closer to the image-capturing element than a predetermined position, and a case that the aperture value effective during a photographing operation indicates a wider aperture opening than a predetermined aperture value.

8. An image-capturing apparatus according to claim 1, wherein the correction device adjusts the first correction quantity and the second correction quantity based upon at least one of:

a shutter speed;

an exit pupil position at a photographic optical system; and an aperture value effective during a photographing operation.

* * * * *